United States Patent [19]

Martin

[11] Patent Number: 5,717,355
[45] Date of Patent: Feb. 10, 1998

[54] METHOD AND APPARATUS WITH ACTIVE FEEDBACK FOR SHIFTING THE VOLTAGE LEVEL OF A SIGNAL

[75] Inventor: Douglas Ele Martin, Round Rock, Tex.

[73] Assignee: International Business Machines Corporation, Armonk, N.Y.

[21] Appl. No.: 570,043

[22] Filed: Dec. 11, 1995

[51] Int. Cl.$^6$ .................................................. H03K 17/04
[52] U.S. Cl. ...................... 327/374; 326/17; 326/63; 326/68; 327/333
[58] Field of Search .................... 327/374, 376, 327/377, 333; 326/17, 62, 63, 68, 75, 80

[56] References Cited

U.S. PATENT DOCUMENTS

| | | | |
|---|---|---|---|
| 4,450,371 | 5/1984 | Bismarck | 326/80 |
| 4,488,066 | 12/1984 | Shoji | 307/452 |
| 4,689,505 | 8/1987 | Ghoshal | 307/482 |
| 4,816,706 | 3/1989 | Dhong et al. | 307/530 |
| 4,893,033 | 1/1990 | Itano et al. | 307/465 |
| 5,019,728 | 5/1991 | Sanwo et al. | 307/475 |
| 5,151,619 | 9/1992 | Austin et al. | 307/473 |
| 5,172,016 | 12/1992 | Dobberpuhl | 307/475 |
| 5,216,299 | 6/1993 | Wanlass | 307/475 |
| 5,223,751 | 6/1993 | Simmons et al. | 307/475 |
| 5,231,318 | 7/1993 | Reddy | 307/530 |
| 5,502,406 | 3/1996 | Traynor et al. | 326/68 |

*Primary Examiner*—Timothy P. Callahan
*Assistant Examiner*—Jung Ho Kim
*Attorney, Agent, or Firm*—Anthony V. S. England

[57] ABSTRACT

In a method and apparatus for shifting the level of a signal a shifter receives a multi-logic state input signal and generates a multi-logic state output signal responsive to changes in logic state of input signal and whose voltage level is shifted with respect to the input signal. The logic low state of the output signal is shifted to a certain voltage level above ground. A first switching device sets the voltage level of the logic low state. A feedback circuit feeds a signal derived from the output signal back to the switching device to precondition the shifter so that the speed of the output signal transition from one state to another is accelerated.

8 Claims, 4 Drawing Sheets

METHOD AND APPARATUS WITH ACTIVE FEEDBACK FOR SHIFTING THE VOLTAGE LEVEL OF A SIGNAL

FIELD OF THE INVENTION

This invention relates generally to drivers in information processing systems, and more specifically may apply to drivers for interfacing circuits having different voltage requirements, such as circuits fabricated by different CMOS technologies.

CROSS REFERENCE TO RELATED PATENT APPLICATION

Method and Apparatus with Preconditioning for Shifting the Voltage Level of a Signal, U.S. patent application, Ser. No. 08/570,042 (AA9-95-0127). This application for U.S. patent is hereby incorporated by reference as if fully set forth herein.

BACKGROUND OF THE INVENTION AND PRIOR ART

The internal voltage supply of an integrated circuit and the corresponding voltage level of signals which can be handled by the circuit are influenced by the requirements and limitations of fabrication technology used for the circuit. It is not unusual for a computer system to have integrated circuits which are fabricated using somewhat different technologies requiring different internal voltage supplies. These devices within the system must nevertheless communicate with one another. For example, a microprocessor integrated circuit may be fabricated using a certain CMOS technology which requires a nominal 2.5 volt internal voltage supply (Vdd), while other devices which communicate with the microprocessor on the computer system interface bus or memory bus are fabricated using a somewhat different CMOS technology requiring a nominal 3.6 volt internal voltage supply (OVdd). The devices having the OVdd internal voltage supply may require an logic high signal, such as one inputted from the microprocessor, to approach OVdd, while the microprocessor can only supply a high level signal approaching Vdd. Also, if OVdd exceeds certain maximum source-to-drain or gate oxide breakdown voltages for FET's in a device, the device may require that a logic low signal, such as one inputted from the microprocessor, be limited to some voltage sufficiently above ground to prevent damage.

It is known by persons of reasonable skill in the art to use a half latch circuit as shown in FIG. 1 to shift the voltage level of a signal. The circuit has a first stage, drain-source coupled pair of FET's, P1 and N1, and a second stage, drain-source coupled pair of FET's, P2 and N2, with the PFET's supplied by a certain voltage Vhh. Coupled to the gate of FET N1 is an input signal with a high logical state at a voltage below that of Vhh and a low logical state at a still lower voltage level. The output of the first stage, is coupled to the gate of FET N2. The output of the second stage provides the half latch circuit output signal, and is also coupled back to the gate of FET P1.

The operation of the half latch circuit of FIG. 1 may be understood as follows. A high input signal turns on N1, pulling down the first stage output and turning on P2. The high input signal is complemented by the inverter and the resulting low inverter output signal turns off N2. With P2 on and N2 off, this pulls up the second stage output signal to a voltage level approaching Vhh for a logical high state. The high output signal is also fed back to the gate of PFET P1, turning off P1 so that P1 does not oppose the pulling down of the first stage output by N1.

A low input signal turns off N1, which does not affect the output of the first stage. The low input signal is also complemented by the inverter. The resulting high inverter output signal turns on N2, which tends to pull down the second stage output. However, a contention exists at this point because P2 remains on, tending to pull up the second stage output. In order to resolve this contention it is typical to select NFET N2 of a size capable of overdriving PFET P2 so that when both N2 and P2 are on the output of stage 2 is pulled down to approach ground for a logic level low signal.

This contention slows down switching of the output signal from a high to a low logical state. Also, when a device driven by the output signal requires that the logic low signal be limited to a voltage above ground, the half latch of FIG. 1 is not suitable. A need therefore exists for an improved voltage level shifter ("shifter") to couple different circuits together and shift the voltage level of signals sent from one circuit to the other, including quickly switching the output signal from a high state to a low state at a predetermined voltage level above ground. Ideally such a voltage shifter circuit would reduce the time delay in output response to a change in input signal and would reduce power consumption.

SUMMARY OF THE INVENTION

It is an objective of the present invention to provide a voltage level shifting inverter for a variety of applications, including the one described above, which sets high and low voltage levels for an output signal and which, in response to an input signal, quickly switches the output signal between the high and low levels.

According to the present invention, the foregoing and other objects are attained by an inverter receiving an multilogic state input signal having certain voltage levels for the logic states. The input signal may be generated by circuitry which operates within certain voltage requirements. In response to the state of the input signal the inverter generates at least one output signal having a logic state which follows and inverts the input signal, but shifts the input signal voltage level to a different voltage level so that the shifted signal can be used in connection with driving a circuit requiring different operating voltage levels as compared to the circuit generating the input signal.

The invention further contemplates that the inverter includes a feedback circuit connected to the output signal and at least one switching device which accelerates the transition of the output signal to the low voltage level when the output signal is switched to a low state.

The invention further contemplates that when the output signal transitions from a high logic state to the low voltage level of a low logic state, the feedback circuit drives the switching device toward an "on" state so that the at least one switching device tends to pull down the output signal faster.

An advantage of the present invention is a reduction in the inherent time delay introduced by shifting the voltage level of signals sent from one circuit to another.

Another advantage is a reduction in the power required for shifting the voltage level of signals sent from one circuit to another.

Additional objects, advantages, and novel features are set forth in the following description, or will be apparent to those skilled in the art or those practicing the invention.

Other embodiments are within the spirit and scope of the invention. These objects and embodiments may be achieved by the combinations pointed out in the appended claims. The invention is intended to be limited only as defined in the claims.

DESCRIPTION OF THE PREFERRED EMBODIMENT

Figure 2:
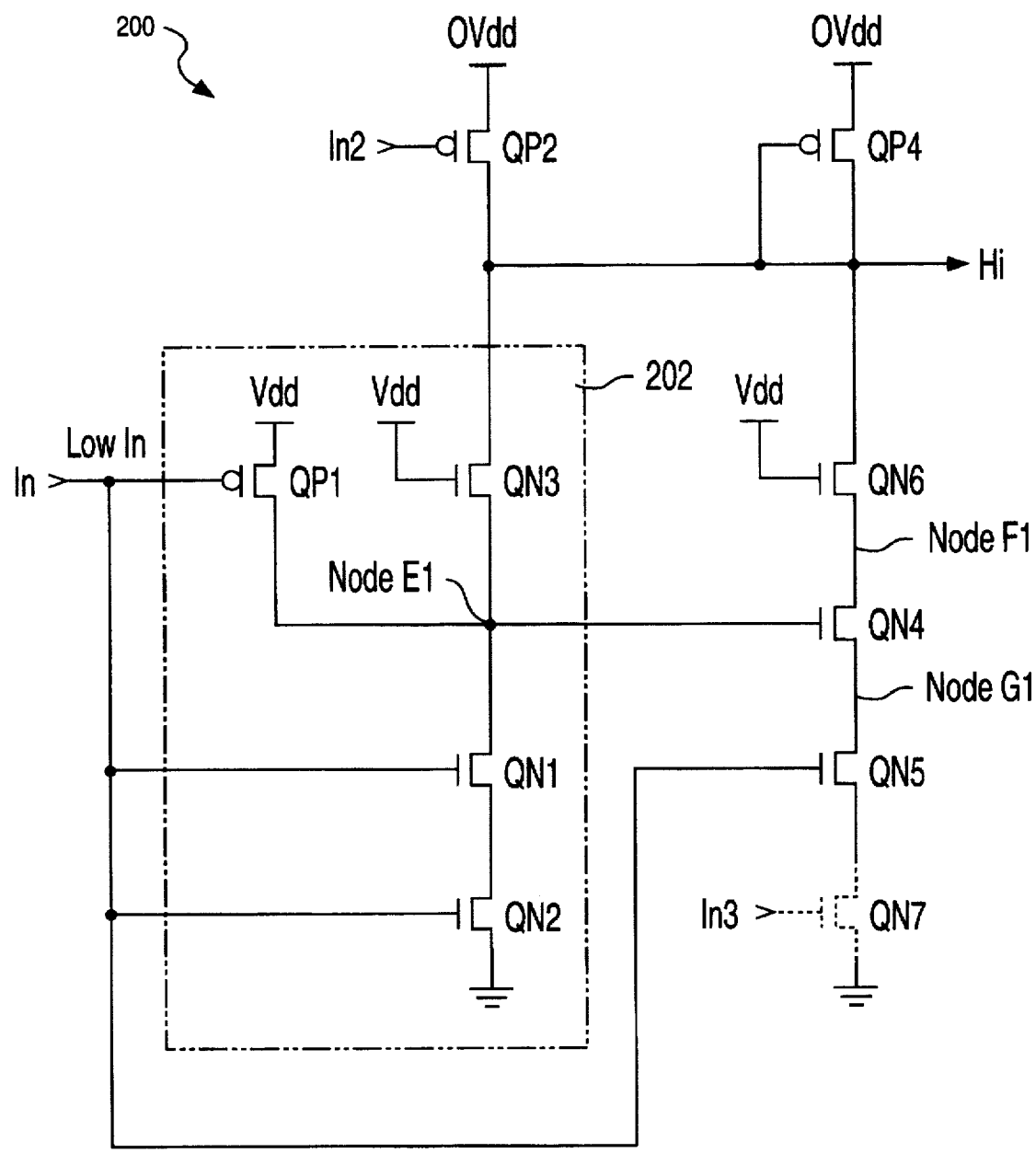
FIG. 2 is a schematic diagram of a voltage level shifting inverter embodying the present invention.

The inverter 200 shown in FIG. 2 uses complimentary metal oxide semiconductor field effect transistors ("CMOS FET's") for the switching devices. N-type channel FET's are referred to herein as "QN1", "QN2", etc. P-type channel FET's are referred to as "QP1", "QP2", etc.

The inverter 200 shifts the voltage level of an input signal, including setting a low voltage level for the output signal low state. The inverter 200 is coupled to a multi-logic state input signal, In. The input signal has certain voltage levels for the logic states. The inverter 200 generates at least one output signal, Out, responsive to the input signal and having logic states corresponding to the input signal, but shifted to different voltage levels. For the Out signal, a high logic state has a voltage level OVdd of about 3.6 volts and a low logic state voltage level Vlim of about 1.2 volts. For the input and signal a high logic state has a voltage level Vdd of about 2.5 volts and a low logic state voltage level of about ground. The inverter 200 operates in a static mode, i.e., holding an output state for an indefinite time as long as the input state is held.

The FET QP2 has its source connected to the higher voltage supply OVdd and its gate connected to an input signal, In2, so that its drain tends to pull up the Out output signal in response to the In2 signal. The QP4 source and drain are also connected to OVdd and the Out signal output line respectively. The QP4 gate is connected to the output line, which is also connected to the drains of QN3 and QN6. The sources of QN3 and QN6 are connected to the gate and drain respectively of QN4 and they protect QN4 from overvoltage, since the gates of QN3 and QN6 are connected to Vdd and they therefore turn off if their source voltage approaches Vdd. QN4 is tied source to drain with QN5, which receives the In signal on its gate and has its source tied to ground.

FET's QP1, QN1 and QN2, together with QN3, provide a feedback circuit 302. The gate of QP1 is tied to the In signal. QP1's source is tied to Vdd. The drains of QP1 and QN1 are tied to the gate of QN4. QN1 is tied source to drain with QN2, which has its source tied to ground.

Figure 1:
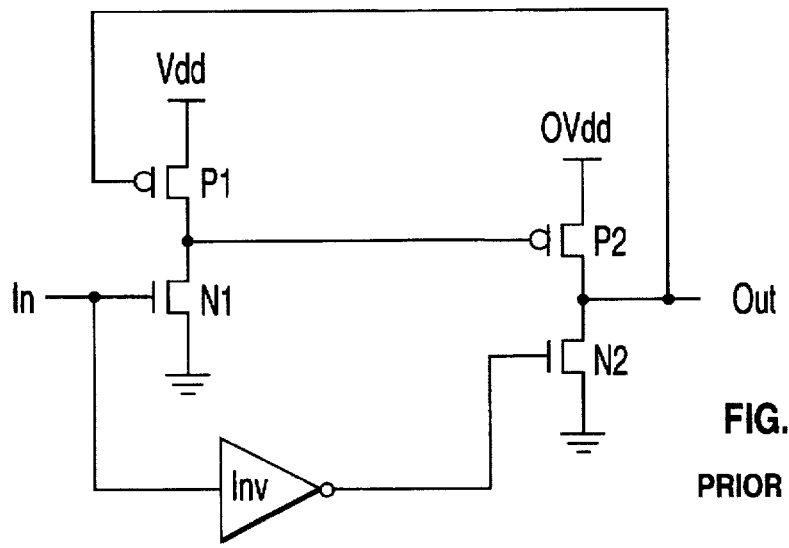
FIG. 1 is a schematic diagram of a prior art half latch circuit which has been used for shifting a voltage level signal.

When the inverter 200 is used in an application similar to that of the first stage of the half latch circuit of FIG. 1, an NFET QN7 may also be'added as shown in dashed lines, for receiving an enabling signal, In3. For such an application the In3 signal is asserted in conjunction with the In2 signal. When the In3 signal is asserted, QN7 is on so that QN4, QN5 and QN6 may be turned on to tend to pull down the output signal. When the In3 signal is not asserted, QN7 is off. This disables any effect of QN4, QN5 and QN6 on the output signal. Thus, when the In2 and In3 signals are asserted, the inverter complements the In signal. When the In2 and In3 signals are not asserted, the inverter output signal, Out, is asserted regardless of the state of the In signal, thereby overriding the In signal. This allows the circuit of FIG. 3 to be used as a first stage for a shifter, as described in FIG's 5 and 6 below, wherein the output signal of the first stage is driven high while the In signal is still high to precondition the second stage in anticipation of the In signal going low.

Figure 3:
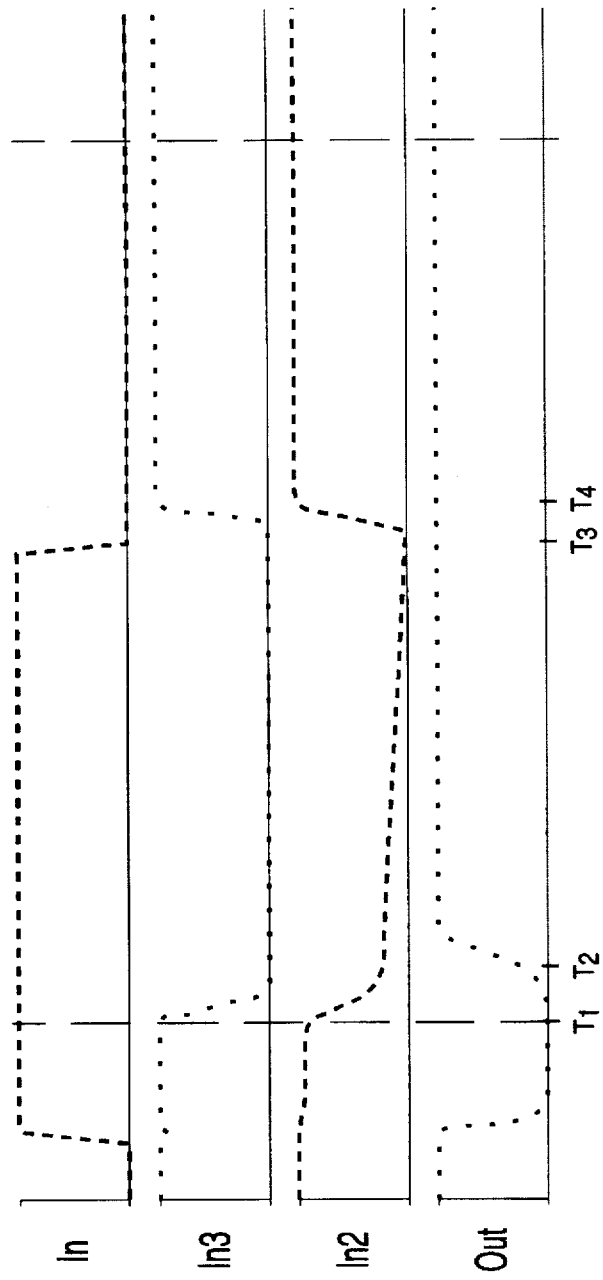
FIG. 3 illustrates the response of the inverter of FIG. 2 to changes in input signals for one application.

FIG. 3 (not to scale) generally shows the response of the inverter 200 of FIG. 2 to the In, In2 and In3 signals, as the inverter 200 would be used in an application similar to that of the first stage of the half latch circuit of FIG. 1. As an arbitrary starting point, consider that at time T1, the In, In2 and In3 signals are high. With In2 and In3 high the inverter 200 is not overridden. QP2 is turned off by the high level In2 signal connected to the QP2 gate. QN5 is turned on by the high level In signal connected to its gate. QN6 is generally held on, as long as its source voltage is greater than a threshold voltage below Vdd, since its gate is tied directly to Vdd. The FET QP1 is also turned off and FET's QN1 and QN2 are also turned on by the high level In signal connected to their gates. QN1, QN2 and QN3 act as a voltage divider and QN3 provides feedback from the QN4 source voltage to the QN4 gate, with the proportions of the voltage divider FET's setting the voltage level of the Out signal so that the Out signal at the output is pulled down through QN4, QN5 and QN6 to a certain voltage, Vlim.

Now, consider that at time T2 the In signal remains high and the In2 and In3 signals go low, as is required for overriding the inverting function of the inverter 200. The low In2 signal turns on QP2. The low In3 signal turns off QN7. With QP2 on and QN7 off, this pulls up the Out signal to a logic high state approaching voltage OVdd. This also pulls up Nodes E and F until QN3 and QN6 turn off due to QN3 and QN6 source voltage (i.e., Node E and Node F respectively) approaching Vdd. In this state, QN4 is precharged, in that its gate and drain voltages with respect to ground tend to drive QN4 on, so that when the QN4 source is switched to ground through QN5, substantially no further charging of QN4 is required and QN4 turns on quickly.

Now, with the In2 and In 3 signals still low, at time T3 the In signal goes low, turning off QN5. This does not change the output. The Out signal is already high due to the In2 signal going low at time T2. With the In2 signal remaining low, when the In signal goes low this turns off QN1 and QN2 and also turns on QP1. Turning on QP1 further precharges QN4, i.e., pulls up Node E to further approach Vdd.

Now, with the In signal still low, consider that at time T4 the In2 and In3 signals go high, turning off QP2 and turning on QN7. QN5 remains off with the In signal low. The In2 signal turning off QP2 does not affect the Out signal, since with QN5 off, and with QN1 and QN2 remaining off, QP4 provides a charging current for any leakage current to hold the Out signal in the high state approaching OVdd. Thus, the inverter 200 remains preconditioned, but without changing the output signal. The precharging of the inverter 200 enables the Out signal to fall more quickly in response to the In signal going high than it would have otherwise. That is, QP2 is turned off and when the In signal goes high at the beginning of the next cycle, the Out signal is pulled low through NFET's QN4, QN5, QN6, and QN7 faster than would be the case if QP2 opposed the NFET's or had to be switched at the same time as the NFET's. Also, the QN4 gate and drain voltages are precharged tending to drive QN4 on, so that when the. QN4 source is switched to ground through QN5, substantially no charging of QN4 is required and QN4 turns on quickly. (QP4 is of a small size to merely provide charging current to hold up the Out signal when QN5 is off, and is too small to significantly hinder QN4, QN5 and QN6 pulling down the Out signal.)

Figure 4:
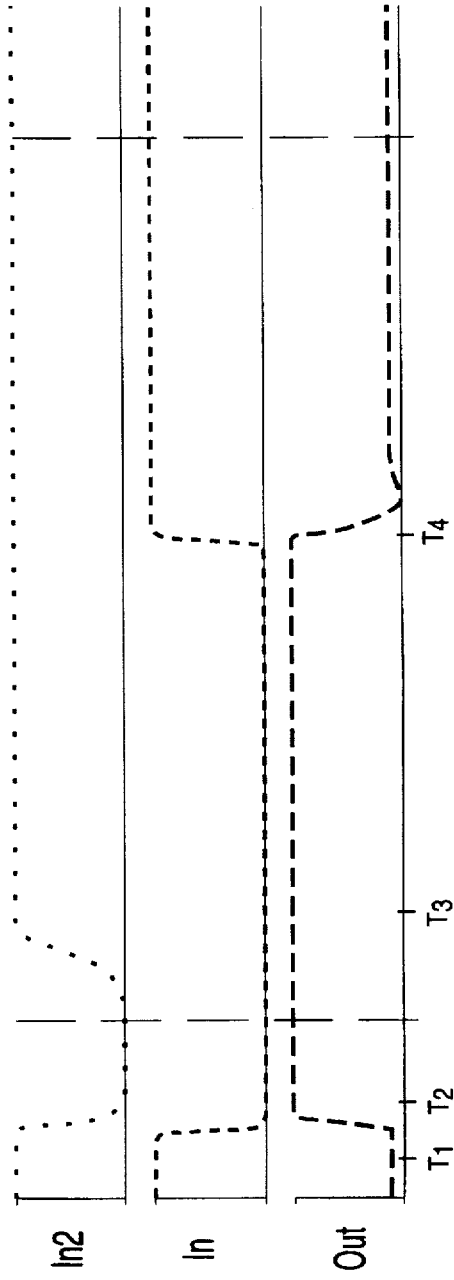
FIG. 4 illustrates the response of the inverter of FIG. 2 to changes in input signals for another application.

FIG. 4 (not to scale) generally shows the response of the inverter 200 of FIG. 2 to the In and In2 signals, as the inverter 200 would be used without QN7 in an application similar to that of the second stage of the half latch circuit of FIG. 1. As an arbitrary starting point, consider that at time T1, the In and In2 signals are high. QP2 is turned off by the high level In2 signal connected to the QP2 gate. QN5 is turned on by the high level In signal connected to its gate. QN6 is generally held on, as long as its source voltage is greater than a threshold voltage below Vdd, since its gate is tied directly to Vdd. The FET QP1 is also turned off and FET's QN1 and QN2 are also turned on by the'high level In signal connected to their gates. QN1, QN2 and QN3 act as a voltage divider and QN3 provides feedback from the QN4 source voltage to the. QN4 gate, with the proportions of the voltage divider FET's setting the voltage level of the Out signal so that the Out signal at the output is pulled down through QN4, QN5 and QN6 to a certain voltage, Vlim.

Now, consider that at time T2 the In and In2 signals go low. The low In2 signal turns on QP2. The In signal going low turns off QN1, QN2 and QN5 and also turns on QP1. With QP2 on and QN5 off, this pulls up the Out signal to a logic high state approaching voltage OVdd. This also pulls up Nodes E and F until QN3 and QN6 turn off due to QN3 and QN6 source voltage (i.e., Node E and Node F respectively) approaching Vdd. In this state, QN4 is precharged, in that its gate and drain voltages with respect to ground tend to drive QN4 on, so that when the QN4 source is switched to ground through QN5, substantially no further charging of QN4 is required and QN4 turns on quickly. Turning on QP1 further precharges QN4, i.e., pulls up Node E to further approach Vdd.

Now, with the In signal still low, consider that at time T3 the In2 signal goes high, turning off QP2. QN5 remains off with the In signal low. The In2 signal turning off QP2 does not affect the Out signal, since with QN5 off, and with QN1 and QN2 remaining off, QP4 provides a charging current for any leakage current to hold the Out signal in the high state approaching OVdd. Thus, the inverter 200 remains preconditioned, but without changing the output signal.

At time T4, when the In signal goes high, the precharging of the inverter 200 enables the Out signal to fall more quickly in response than it would have otherwise. That is, QP2 is turned off and when the In signal goes high at time T4, the Out signal is pulled low through NFET's QN4, QN5 anti QN6 faster than would be the case if QP2 opposed the NFET's or bad to be switched at the same time as the NFET's. Also, the QN4 gate and drain voltages are precharged tending to drive QN4 on, so that when the QN4 source is switched to ground through QN5, substantially no charging of QN4 is required and QN4 turns on quickly. (QP4 is of a small size to merely provide charging current to hold up the Out signal when QN5 is off, and is too small to significantly hinder QN4, QN5 and QN6 pulling down the Out signal.)

The initial current available for switching Out to a low state for QN4 is determined by the gate to source voltage applied to QN4 when QN5 switches and pulls the source of QN4 toward ground. The drain to source switching current of QN4 can be approximated by:

Ids=k (Vgs–Vt)$^2$, where Vt is the threshold voltage for NFET QN4. The switching time of inverter 200 or inverter 300 for switching Out from a high state to a low state is dependent upon the initial available switching current from QN4, among other things. Comparing the initial switching current of inverter 200 and inverter 300, for inverter 200, Ids=k (Vdd–2Vt)$^2$, whereas for inverter 300, Ids=k (Vdd–Vt)$^2$. With Vdd=2.5 volts and Vt=0.6 volts, the initial switching current available through QN4 is 2.1 times greater for inverter 300 than for inverter 200, and the switching time is accordingly substantially faster for inverter 300.

Figure 5:
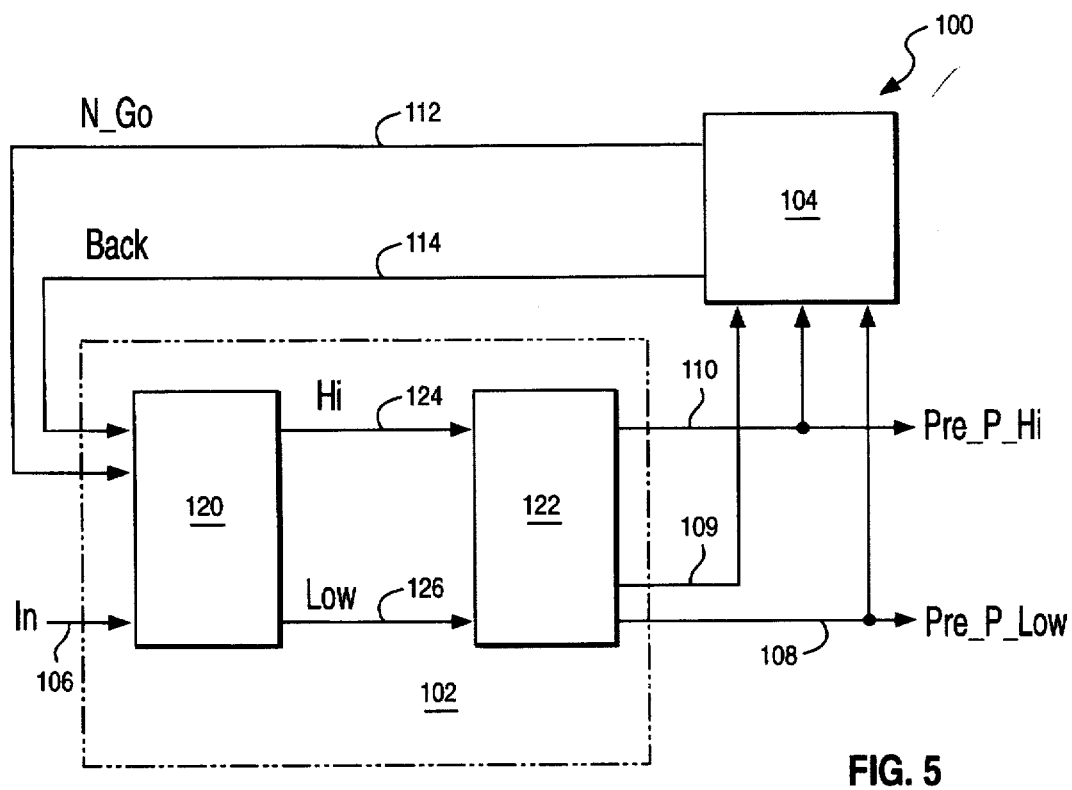
FIG. 5 is a block diagram for an embodiment of the invention, showing interconnected shifter and feedback elements.

Referring now to FIG. 5, an embodiment is shown wherein the inverting shifter 200 of FIG. 2 is used as a first stage of a two stage shifter 102. Driver 100, in FIG. 5, includes a shifter stage 102 and a feedback stage 104. Shifter 102 is coupled to a multi-logic state input signal over line 106. The input signal has certain voltage levels for the logic states. The voltage levels for the logic states of the feedback signals may be essentially the same as the voltage levels for the logic states of the shifter 102 output signals. In response to the state of the input signal, the shifter 102 generates a first and second output signal having logic states corresponding to the input signal, but one of the output signals is shifted to a different voltage level so that the shifted signal can be used to drive a circuit requiring different voltage levels than a circuit generating the input signal to the shifter. The shifter 102 operates in a static mode, i.e., holding an output state for an indefinite time as long as the input state is held.

The feedback circuit 104 is coupled to the shifter 102 output signals by lines 108 through 110. In response to the shifter 102 output signals the feedback stage 104 generates a first and second multi-logic state feedback signal responsive to the received signals. The feedback signals are coupled to the shifter 102 over lines 112 and 114. The voltage levels for the logic states of the feedback signals are essentially the same as the voltage levels for the logic states of the shifter output signals.

The signals have high and low logic states. For a first set of signals, Hi, Pre_P_Hi and Back, a high logic state has a voltage level of about OVdd and a low logic level of about Vlim, which in the preferred embodiment is set at about 1.2 volts to avoid exceeding breakdown voltage limits. For a second set of signals, In, Pre_P_Low, N_Pre_P_Low, and Back, a high logic state has a voltage level of about Vdd and a low logic level of about ground.

The shifter 102 has a first shifter stage 120 and a second stage 122. The first stage 120 is coupled by the input line 106 to an external device (not shown) which generates the input signal, In. The first stage 120 output signals Hi and Low are coupled to second stage 122 by output lines 124 and 126. The second stage 122 output signals Pre_P_Hi, Pre_P_Low and N_Pre_P_Low are coupled to the feedback stage 104 and externally by output lines 108 through 110. The feedback stage 104 output signals "Back" and "N_Go" are coupled to the first stage 120 of shifter 102 by lines 112 and 114.

Figure 6:
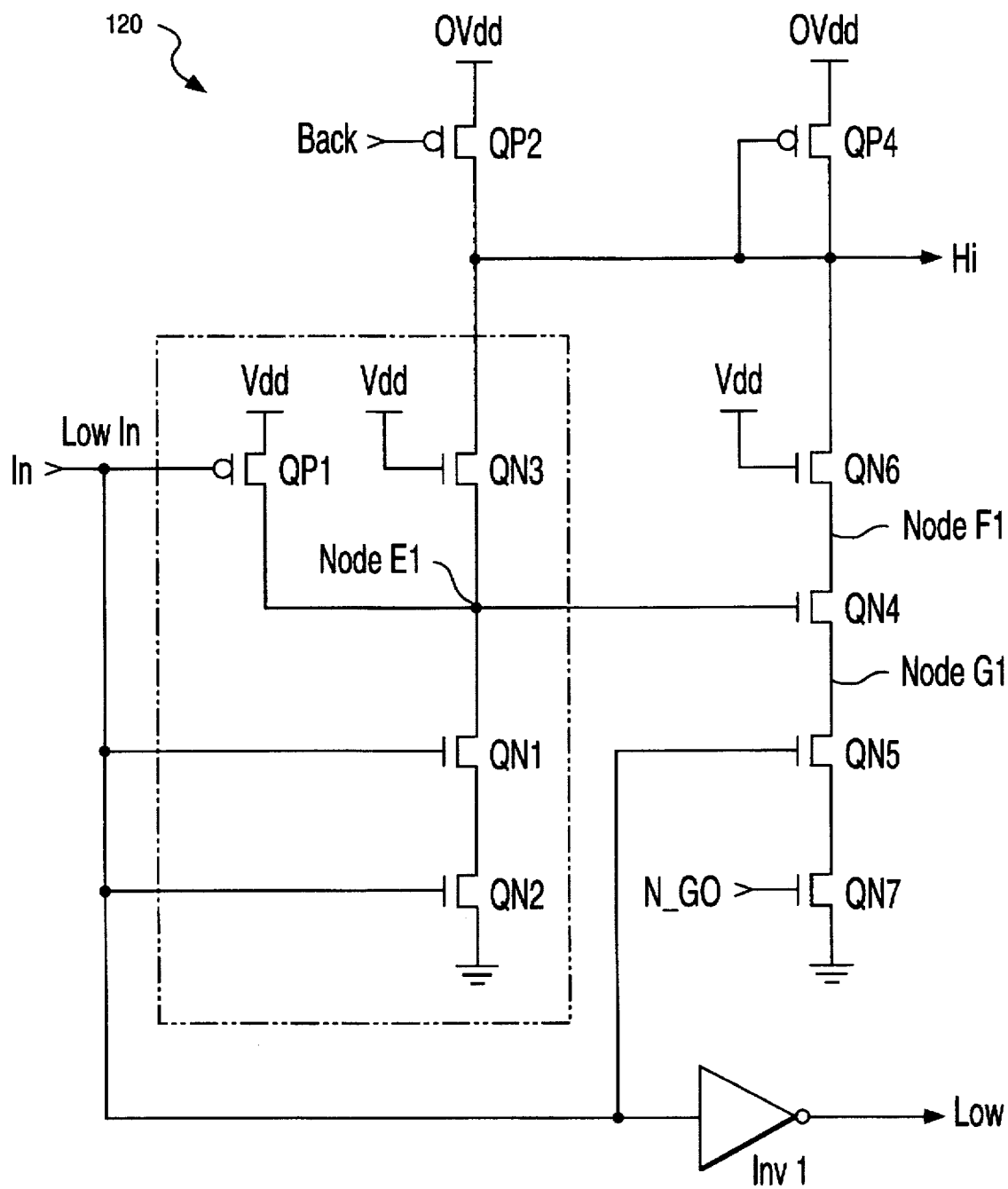
FIG. 6 is a schematic which includes the inverting shifter 200 of FIG. 2 in stage 1 of the shifter 102 of FIG. 5.

Referring now to FIG. 6, a schematic is shown which includes the inverting shifter 200, of FIG. 2, in stage 1 of the shifter 102 of FIG. 5. The circuitry shown in FIG's 2 and 6 correspond, except that FIG. 6 adds an inverter Inv1 to the circuitry of FIG. 2, wherein the inverter Inv1 receives the input signal, in, and outputs the logically inverted signal, Low, to stage 2 (element 122 in FIG. 5).

Although the present invention and its advantages have been described in detail, it should be understood that various changes, substitutions and alterations can be made without departing from the spirit and scope of the invention as defined by the following claims.

What is claimed is:

1. Circuitry, referred to herein as a shifter, for receiving an input signal and generating an output signal having a voltage level shifted with respect to the input signal, the shifter comprising:

an input node for receiving a multi-logic state input signal; a first switching device for setting a voltage level of a logic low state of a multi-logic state output signal, wherein the output signal is responsive to changes in logic state of the input signal, and the logic low state of the output signal is shifted to a certain voltage level above ground; and a feedback circuit feeding a signal derived from the output signal output signal back to the switching device to precondition the shifter so that the speed of the output signal transition from one state to another is accelerated.

2. The apparatus of claim 1, wherein the feedback circuit includes a second switching device coupled to the input signal and the first switching device for further accelerating the speed of output signal transition.

3. The apparatus of claim 2, wherein the feedback circuit includes a series of switching devices which act as part of a voltage divider to establish the low voltage level of the output signal.

4. The apparatus of claim 2, wherein the second switching device tends to pull down the output signal when the input signal is high, and wherein the shifter includes a third switching device responsive to an enabling signal which defeats the tendency of the second switching device to pull down the output signal so that the shifter output signal may be overriden for precharging a second shifter.

5. A method for shifting the level of a signal, comprising:

receiving, by circuitry referred to herein as a shifter, a multi-logic state input signal;

generating, in the shifter, a multi-logic state output signal responsive to changes in logic state of the input signal and whose voltage level is shifted with respect to the input signal, wherein the logic low state of the output signal is shifted to a certain voltage level above ground;

switching a first switching device for setting the voltage level of the logic low state; and feeding a signal derived from the output signal back to the switching device to precondition the shifter so that the speed of the output signal transition from one state to another is accelerated.

6. The method of claim 5, further comprising:

switching a second switching device coupled to the input signal and the first switching device for further accelerating the speed of output signal transition.

7. The method of claim 6, further comprising:

dividing a voltage drop in the feedback circuit among a series of switching devices to establish the low voltage level of the output signal.

8. The apparatus of claim 7, further comprising tending to pull down the output signal by the second switching device when the input signal is high; and defeating the second switching device tending to pull down the output signal by switching a third switching device, so that the shifter output signal may be overriden for precharging a second shifter.

* * * * *